(12) United States Patent
Yang et al.

(10) Patent No.: US 11,862,548 B2
(45) Date of Patent: Jan. 2, 2024

(54) PACKAGE SUBSTRATE FILM AND SEMICONDUCTOR PACKAGE INCLUDING THE SAME

(71) Applicant: SAMSUNG ELECTRONICS CO., LTD., Suwon-si (KR)

(72) Inventors: Kyoungsuk Yang, Hwaseong-si (KR); Soyoung Lim, Hwaseong-si (KR); Yechung Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 17/340,280

(22) Filed: Jun. 7, 2021

(65) Prior Publication Data
US 2022/0173026 A1 Jun. 2, 2022

(30) Foreign Application Priority Data
Nov. 30, 2020 (KR) .......................... 10-2020-0165071

(51) Int. Cl.
*H01L 23/498* (2006.01)
*H01L 21/48* (2006.01)
*H01L 21/66* (2006.01)
*H01L 23/538* (2006.01)
*H01L 25/18* (2023.01)

(52) U.S. Cl.
CPC ...... *H01L 23/49838* (2013.01); *H01L 21/481* (2013.01); *H01L 21/486* (2013.01); *H01L 22/14* (2013.01); *H01L 23/49827* (2013.01); *H01L 23/5384* (2013.01); *H01L 23/5386* (2013.01);
(Continued)

(58) Field of Classification Search
CPC ............ H01L 23/49838; H01L 21/481; H01L 21/486; H01L 22/14; H01L 23/49827; H01L 23/5384; H01L 23/5386; H01L 23/4985; H01L 23/5387; H01L 25/18
See application file for complete search history.

(56) References Cited

U.S. PATENT DOCUMENTS 4,486,705 A * 12/1984 Stopper ................... H01L 22/22
257/E21.526
7,217,990 B2 5/2007 Chung
(Continued)

FOREIGN PATENT DOCUMENTS

JP 2019-522378 A 8/2019
KR 10-0403621 B1 10/2003
(Continued)

*Primary Examiner* — Benjamin Tzu-Hung Liu
(74) *Attorney, Agent, or Firm* — Muir Patent Law, PLLC

(57) ABSTRACT

A package substrate film including a film substrate including upper and lower surfaces; a test pattern including an upper test line pattern extending on the upper surface of the film substrate; a lower test line pattern extending on the lower surface of the film substrate; a first test via pattern penetrating the film substrate and connecting the upper test line pattern to the lower test line pattern; a second test via pattern penetrating the film substrate outside the first test via pattern and connecting the upper test line pattern to the lower test line pattern; and a test pad between the first test via pattern and the second test via pattern, the test pad including first test pad at an outer side of the first test via pattern; and second test pad at an inner side of the second test via pattern and facing the first test pad.

20 Claims, 16 Drawing Sheets

(52) U.S. Cl.
CPC ...... *H01L 23/4985* (2013.01); *H01L 23/5387* (2013.01); *H01L 25/18* (2013.01)

(56) References Cited

U.S. PATENT DOCUMENTS

| | | |
|---|---|---|
| 7,442,968 B2 | 10/2008 | Kim et al. |
| 8,853,694 B2 | 10/2014 | Han et al. |
| 9,922,891 B2 * | 3/2018 | Lim ........................ H01L 23/66 |
| 10,304,764 B2 | 5/2019 | Chung et al. |
| 10,699,974 B2 | 6/2020 | Lim et al. |
| 2005/0030055 A1 * | 2/2005 | Tran .................. G01R 31/2884 |
| | | 324/750.3 |
| 2013/0221353 A1 * | 8/2013 | Yang ........................ H01L 22/34 |
| | | 257/E23.179 |
| 2019/0122943 A1 * | 4/2019 | Lim .................... H01L 23/4985 |
| 2020/0075632 A1 * | 3/2020 | Long ................. H01L 29/41733 |
| 2021/0057298 A1 * | 2/2021 | Tsai .................... H01L 21/6835 |

FOREIGN PATENT DOCUMENTS

| | | |
|---|---|---|
| KR | 10-0505665 B1 | 7/2005 |
| KR | 10-2019-0055416 A | 5/2019 |

\* cited by examiner

PACKAGE SUBSTRATE FILM AND SEMICONDUCTOR PACKAGE INCLUDING THE SAME

CROSS-REFERENCE TO RELATED APPLICATION

Korean Patent Application No. 10-2020-0165071, filed on Nov. 30, 2020 in the Korean Intellectual Property Office, and entitled: "Package Substrate Film and Semiconductor Package Including the Same," is incorporated by reference herein in its entirety.

BACKGROUND

1. Field

Embodiments relate to a package substrate film and a semiconductor package including the same.

2. Description of the Related Art

According to the miniaturization and lightening trend of electronic products, a chip-on-film (COF) package may be provided as a high-density semiconductor chip mounting technique. The COF package may include a semiconductor chip bonded to a substrate by using a flip chip bonding, and a redistribution pattern that is connected to the semiconductor chip and densely arranged on the substrate. In addition, the substrate for manufacturing the COF package may include test pads for testing signal transfer characteristics of the semiconductor chip.

SUMMARY

The embodiments may be realized by providing a package substrate film including a film substrate including an upper surface and a lower surface; a test pattern including an upper test line pattern extending on the upper surface of the film substrate; a lower test line pattern extending on the lower surface of the film substrate; a first test via pattern penetrating the film substrate and connecting the upper test line pattern to the lower test line pattern; a second test via pattern penetrating the film substrate outside the first test via pattern and connecting the upper test line pattern to the lower test line pattern; and a test pad between the first test via pattern and the second test via pattern, the test pad including at least one first test pad at an outer side of the first test via pattern; and at least one second test pad at an inner side of the second test via pattern and facing the at least one first test pad.

The embodiments may be realized by providing a package substrate film including a film substrate including an upper surface and a lower surface, the film substrate including an input section, an output section, a chip section between the input section and the output section, and a test section arranged outside the output section; a redistribution pattern including an upper redistribution line pattern extending on the upper surface of the film substrate; a lower redistribution line pattern extending on the lower surface of the film substrate; and a redistribution via pattern penetrating the film substrate and connecting the upper redistribution line pattern to the lower redistribution line pattern; and a test pattern including an upper test line pattern extending on the upper surface of the film substrate; a lower test line pattern extending on the lower surface of the film substrate; a first test via pattern penetrating the film substrate and connecting the upper test line pattern to the lower test line pattern; a second test via pattern penetrating the film substrate at an outer side of the first test via pattern and connecting the upper test line pattern to the lower test line pattern; and a test pad on the test section of the film substrate and between the first test via pattern and the second test via pattern, the test pad including at least one first test pad at an outer side of the first test via pattern and at least one second test pad at an inner side of the second test via pattern and facing the at least one first test pad.

The embodiments may be realized by providing a semiconductor package including a package substrate film including a film substrate including an upper surface and a lower surface, the film substrate including a test section, an input section, an output section, and a chip section between the input section and the output section; a redistribution pattern including an upper redistribution line pattern extending on the upper surface of the film substrate; a lower redistribution line pattern extending on the lower surface of the film substrate; and a redistribution via pattern penetrating the film substrate and connecting the upper redistribution line pattern to the lower redistribution line pattern; a test pattern including an upper test line pattern extending on the upper surface of the film substrate; a lower test line pattern extending on the lower surface of the film substrate; a first test via pattern penetrating the film substrate and connecting the upper test line pattern to the lower test line pattern; a second test via pattern penetrating the film substrate and connecting the upper test line pattern to the lower test line pattern; and a test pad on the test section of the film substrate and between the first test via pattern and the second test via pattern, the test pad including at least one first test pad at an outer side of the first test via pattern and at least one second test pad at an inner side the second via pattern; and a semiconductor chip on the chip section of the film substrate.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
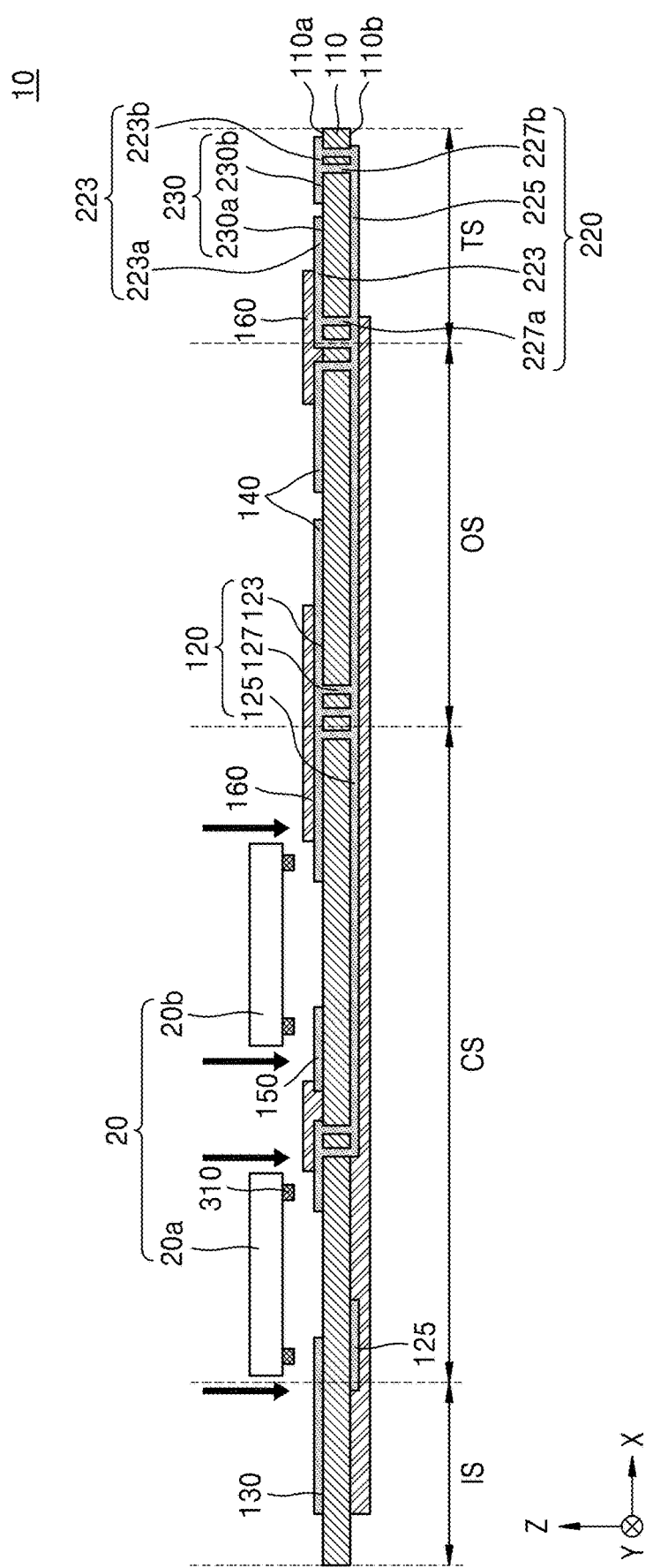
FIG. 1 is a cross-sectional view of a package substrate film, according to an embodiment.

FIG. 1 is a cross-sectional view of a package substrate film 10, according to an embodiment.

The package substrate film 10 according to an embodiment may include a film constituting a chip-on-film (COF) package. In an implementation, the package substrate film 10 may include a film configured to mount or accommodate a semiconductor chip 20.

Referring to FIG. 1, the package substrate film 10 according to an embodiment may include a film substrate 110, a redistribution pattern 120, an input pad 130, an output pad 140, a chip bonding pad 150, a passivation layer 160, a test pattern 220, a test pad 230, or the like.

The film substrate 110 of the package substrate film 10 may include a film for mounting the semiconductor chip 20. In an implementation, the film substrate 110 may include an insulating material. In an implementation, the film substrate 110 may include a material of polyimide or epoxy resin. In an implementation, the film substrate 110 may include a flexible film.

In an implementation, the film substrate 110 may include an upper surface 110a and a lower surface 110b. The upper surface 110a of the film substrate 110 may be one surface of the film substrate 110, on which the semiconductor chip 20 is mounted or mountable and the test pad 230 is arranged. In an implementation, the lower surface 110b of the film substrate 110 may be one surface of the film substrate 110 opposite to the upper surface 110a.

In an implementation, the film substrate 110 may include a chip section CS, an input section IS, an output section OS, and a test section TS. The chip section CS may be one section of the film substrate 110 on which the semiconductor chip 20 is to be mounted. In an implementation, the chip section CS may be on or at the center portion of the film substrate 110.

The input section IS may be on or at one side of the chip section CS, and may be a section of the film substrate 110 for signal input. In an implementation, the input section IS of the film substrate 110 may be connected to a printed circuit board (PCB), and may be one section of the film substrate 110 that receives a signal from the PCB.

The output section OS may be on or at the other side of the chip section CS, and may be a section of the film substrate 110 for signal input. In an implementation, the output section OS of the film substrate 110 may be connected to a display panel, and may be a section of the film substrate 110 that transmits a signal to the display panel.

The test section TS may be on or at an (e.g., outer) edge portion of the film substrate 110. In an implementation, the test section TS may be outside the output section OS. In an implementation, the test section TS may be a section of the film substrate 110 for testing a signal flow of the package substrate film 10. In an implementation, the test section TS may be a section of the film substrate 110 that is removed during the operation of individualization of the film substrate 110.

The redistribution pattern 120 of the package substrate film 10 may extend on the film substrate 110, and may include a pattern of a conductive material that electrically connects the semiconductor chip 20, the input pad 130, the output pad 140, and the chip bonding pad 150 to each other.

In an implementation, the material of the redistribution pattern 120 may include a metal, e.g., copper (Cu), nickel (Ni), aluminum (Al), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or an alloy thereof. As used herein, the term "or" is not an exclusive term, e.g., "A or B" would include A, B, or A and B.

In an implementation, the redistribution pattern 120 may include an upper redistribution line pattern 123, a lower redistribution line pattern 125, and a redistribution via pattern 127.

In an implementation, the upper redistribution line pattern 123 may include a pattern extending in a horizontal direction (e.g., X direction) on the upper surface 110a of the film substrate 110. In an implementation, the upper redistribution line pattern 123 may be in or on the chip section CS, the input section IS, and the output section OS of the film substrate 110. In an implementation, the upper redistribution line pattern 123 may include a pattern connected to the input pad 130, the output pad 140, and the chip bonding pad 150.

In an implementation, the lower redistribution line pattern 125 may include a pattern extending in the horizontal direction (e.g., X direction) on the lower surface 110b of the film substrate 110. In an implementation, the lower redistribution line pattern 125 may be in or on the chip section CS, the input section IS, and the output section OS of the film substrate 110. In an implementation, the lower redistribution line pattern 125 may include a pattern connected to the input pad 130, the output pad 140, and the chip bonding pad 150.

In an implementation, the redistribution via pattern 127 may include a pattern that penetrates the film substrate 110 in a vertical direction (e.g., Z direction), and connects the upper redistribution line pattern 123 to the lower redistribution line pattern 125. In an implementation, the redistribution via pattern 127 may penetrate at least one of the chip section CS, the input section IS, and the output section OS of the film substrate 110, and may connect the upper redistribution line pattern 123 to the lower redistribution line pattern 125.

The input pad 130 of the package substrate film 10 may be on the upper surface 110a of the film substrate 110. The input pad 130 may be on the input section IS of the film substrate 110.

In an implementation, the input pad 130 may include a pad for the signal input of the package substrate film 10. In an implementation, the input pad 130 may be connected to a portion of a PCB, such as a flexible PCB (FPCB), and may include a pad for receiving an electrical signal from the PCB.

In an implementation, the input pad 130 may be electrically connected to the chip bonding pad 150 via the upper redistribution line pattern 123, the lower redistribution line pattern 125, and the redistribution via pattern 127.

In an implementation, one side of the input pad 130 may be connected to the upper redistribution line pattern 123. In an implementation, an area of the input pad 130 may be greater than that of the upper redistribution line pattern 123.

In an implementation, a material of the input pad 130 may include a metal, e.g., copper (Cu), nickel (Ni), aluminum (Al), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or an alloy thereof.

The output pad 140 of the package substrate film 10 may be on the upper surface 110a of the film substrate 110. The output pad 140 may be on the output section OS of the film substrate 110.

In an implementation, the output pad 140 may include a pad for the signal output of the package substrate film 10. In an implementation, the output pad 140 may be connected to a portion of the display panel, and may include a pad for transmitting an electrical signal to the display panel.

In an implementation, the output pad 140 may be electrically connected to the chip bonding pad 150 via the upper redistribution line pattern 123, the lower redistribution line pattern 125, and the redistribution via pattern 127.

In an implementation, one side of the output pad 140 may be connected to the upper redistribution line pattern 123. In an implementation, an area of the output pad 140 may be greater than that of the upper redistribution line pattern 123.

In an implementation, the material of the output pad 140 may include a metal, e.g., copper (Cu), nickel (Ni), aluminum (Al), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or an alloy thereof.

The chip bonding pad 150 of the package substrate film 10 may be on the upper surface 110a of the film substrate 110. The chip bonding pad 150 may be on the chip section CS (e.g., between the input section IS and the output section OS).

In an implementation, the chip bonding pad 150 may include a pad for electrical connection to the semiconductor chip 20. In an implementation, the chip bonding pad 150 may be connected to the chip connection terminal 310 of the semiconductor chip 20, and may include a pad for signal transfer of the semiconductor chip 20.

In an implementation, the chip bonding pad 150 may be electrically connected to the input pad 130 and the output pad 140 via the upper redistribution line pattern 123, the lower redistribution line pattern 125, and the redistribution via pattern 127.

In an implementation, one side of the chip bonding pad 150 may be connected to the upper redistribution line pattern 123. In an implementation, an area of the chip bonding pad 150 may be greater than that of the upper redistribution line pattern 123.

In an implementation, the material of the chip bonding pad 150 may include a metal, e.g., copper (Cu), nickel (Ni), aluminum (Al), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or an alloy thereof.

The passivation layer 160 of the package substrate film 10 may include a layer extending conformally along the upper surface 110a and the lower surface 110b of the film substrate 110.

In an implementation, the passivation layer 160 may cover the upper redistribution line pattern 123 on the upper surface 110a of the film substrate 110. In an implementation, the passivation layer 160 may expose the input pad 130, the output pad 140, the chip bonding pad 150, and the test pad 230, which are on the upper surface 110a of the film substrate 110. In an implementation, the passivation layer 160 may cover the lower redistribution line pattern 125 on the lower surface 110b of the film substrate 110.

In an implementation, the passivation layer 160 may include an insulating material. In an implementation, a material of the passivation layer 160 may include, e.g., silicon nitride (SiN), silicon oxynitride (SiON), silicon oxide ($SiO_2$), silicon carbonate (SiOCN), silicon carbon nitride (SiCN), or a combination thereof.

The test pattern 220 of the package substrate film 10 may extend on the film substrate 110, and may include a pattern of a conductive material for testing a signal flow of the package substrate film 10.

In an implementation, the material of the test pattern 220 may include a metal, e.g., copper (Cu), nickel (Ni), aluminum (Al), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or an alloy thereof.

In an implementation, the test pattern 220 may include an upper test line pattern 223, a lower test line pattern 225, a first test via pattern 227a, and a second test via pattern 227b.

In an implementation, the upper test line pattern 223 may include a pattern extending in the horizontal direction (e.g., X direction) on the upper surface 110a of the film substrate 110. In an implementation, the upper test line pattern 223 may extend on the chip section CS, the input section IS, the output section OS, and the test section TS of the film substrate 110. In an implementation, the upper test line pattern 223 may include a test pattern connected to the input pad 130, the output pad 140, and the chip bonding pad 150.

In an implementation, the lower test line pattern 225 may include a pattern extending in the horizontal direction (e.g., X direction) on the lower surface 110b of the film substrate 110. In an implementation, the lower test line pattern 225 may extend on the chip section CS, the input section IS, the output section OS, and the test section TS of the film substrate 110. In an implementation, the lower test line pattern 225 may include a test pattern connected to the input pad 130, the output pad 140, and the chip bonding pad 150.

In an implementation, the first test via pattern 227a and the second test via pattern 227b may include patterns that penetrate the film substrate 110 in the vertical direction (e.g., Z direction), and connect the upper test line pattern 223 to the lower test line pattern 225.

In an implementation, the first test via pattern 227a may be inside the second test via pattern 227b. In an implementation, the first test via pattern 227a may be closer to the chip section CS than the second test via pattern 227b is to the chip section CS (e.g., in the X direction).

In an implementation, the first test via pattern 227a may pass through at least one of the chip section CS, the input section IS, and the output section OS of the film substrate 110. In an implementation, when the package substrate film 10 is individualized, the first test via pattern 227a may not be removed but may remain.

In an implementation, the first test via pattern 227a may pass through the test section TS of the film substrate 110. In an implementation, when the package substrate film 10 is individualized, the first test via pattern 227a may be removed.

In an implementation, a portion of the first test via pattern 227a may pass through at least one of the chip section CS, the input section IS, and the output section OS of the film substrate 110, and the other portion thereof may pass through the test section TS of the film substrate 110. In an implementation, when the package substrate film 10 is individualized, a portion of the first test via pattern 227a may be removed, and the other portion thereof may remain.

In an implementation, the second test via pattern 227b may pass through the test section TS among the sections of the film substrate 110. In an implementation, when the package substrate film 10 is individualized, the second test via pattern 227b may be removed.

In an implementation, the upper test line pattern 223 may include a first upper test line pattern 223a and a second upper test line pattern 223b. In an implementation, the first upper test line pattern 223a may include a pattern for connecting the first test via pattern 227a to a first test pad 230a. In an implementation, the second upper test line pattern 223b may include a pattern for connecting the second test via pattern 227b to a second test pad 230b.

In an implementation, the first upper test line pattern 223a may be connected to the first test via pattern 227a, and may extend outwardly (e.g., in the X direction) from the first test via pattern 227a. In an implementation, the first upper test line pattern 223a may be connected to the first test via pattern 227a, and may extend in a direction toward the test section TS from the output section OS of the film substrate 110.

In an implementation, the second upper test line pattern 223b may be connected to the second test via pattern 227b, and may extend inwardly from the second test via pattern 227b (e.g., in the X direction). In an implementation, the second upper test line pattern 223b may be connected to the second test via pattern 227b, and may extend in a direction toward the output section OS from the test section TS of the film substrate 110.

In an implementation, a signal flow direction of the first upper test line pattern 223a may be different from (e.g., opposite to) that of the second upper test line pattern 223b. In an implementation, the signal flow direction of the first upper test line pattern 223a may be a direction from the output section OS to the test section TS, and the signal flow direction of the second upper test line pattern 223b may be a direction from the test section TS to the output section OS.

The test pad 230 of the package substrate film 10 may be on the upper surface 110a of the film substrate 110. The test pad 230 may be on the test section TS of the film substrate 110.

In an implementation, the test pad 230 may be between the first test via pattern 227a and the second test via pattern 227b. In an implementation, the first test pad 230a and the second test pad 230b may be between the first test via pattern 227a and the second test via pattern 227b, and may face each other.

In an implementation, the test pad 230 may be used in a test process of the package substrate film 10, and may be a pad to be removed in an individualization process of the package substrate film 10.

In an implementation, the material of the test pad 230 may include a metal, e.g., copper (Cu), nickel (Ni), aluminum (Al), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or an alloy thereof.

In an implementation, the test pad 230 may include the first test pad 230a and the second test pad 230b. In an implementation, the first test pad 230a and the second test pad 230b may be on the test section TS of the film substrate 110.

In an implementation, the first test pad 230a may include a test pad connected to the first test via pattern 227a and the first upper test line pattern 223a. One side of the first test pad 230a may be connected to a first upper test line pattern 223a. In an implementation, an area of the first test pad 230a may be greater than that of the first upper test line pattern 223a.

In an implementation, the second upper test line pattern 223b may include a test pad connected to the second test via pattern 227b and the second upper test line pattern 223b. One side of the second test pad 230b may be connected to a second upper test line pattern 223b. In an implementation, an area of the second test pad 230b may be greater than that of the second upper test line pattern 223b.

Figure 2:
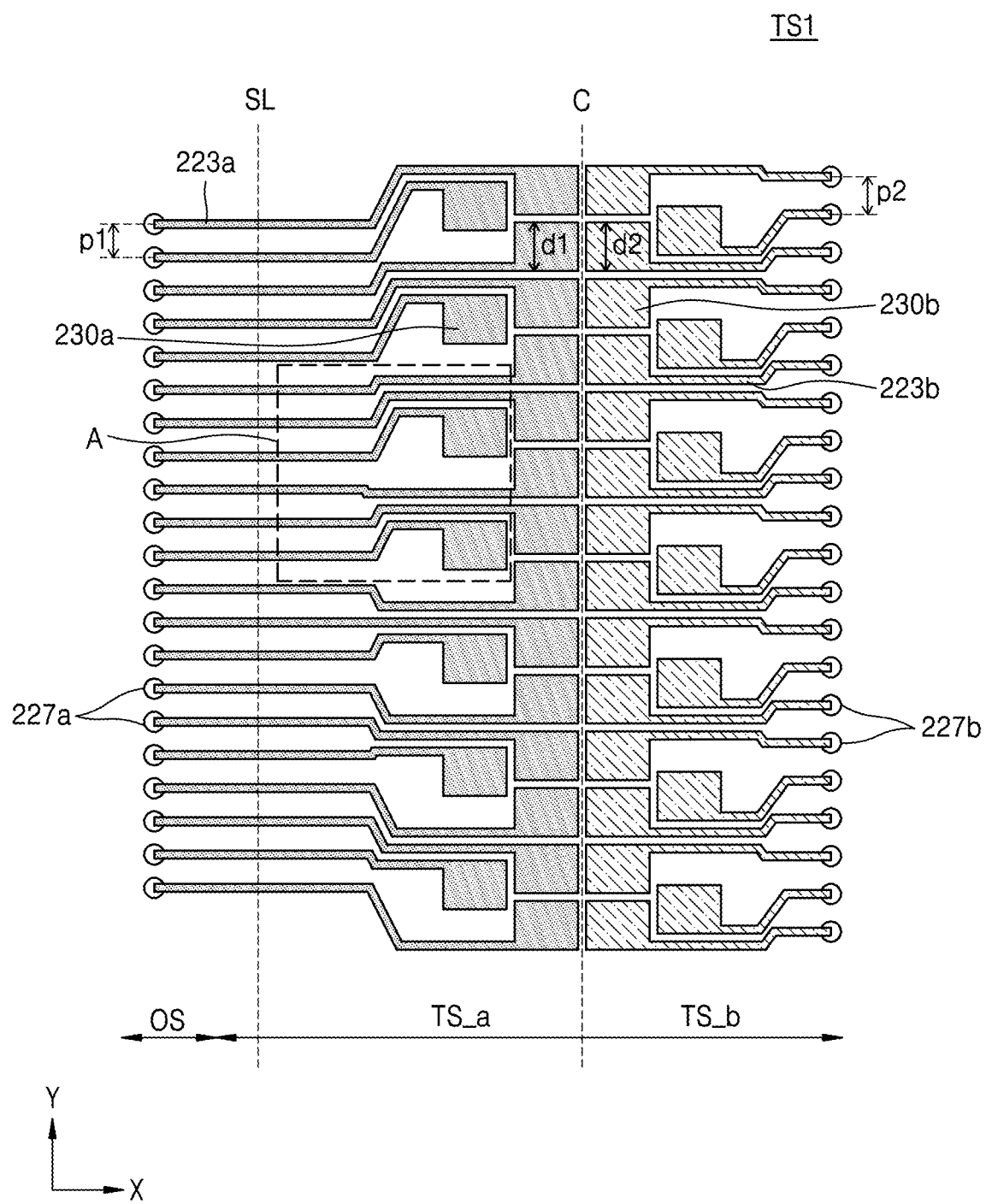
FIG. 2 is a plan view of a test section of a package substrate film, according to an embodiment.
Figure 3:
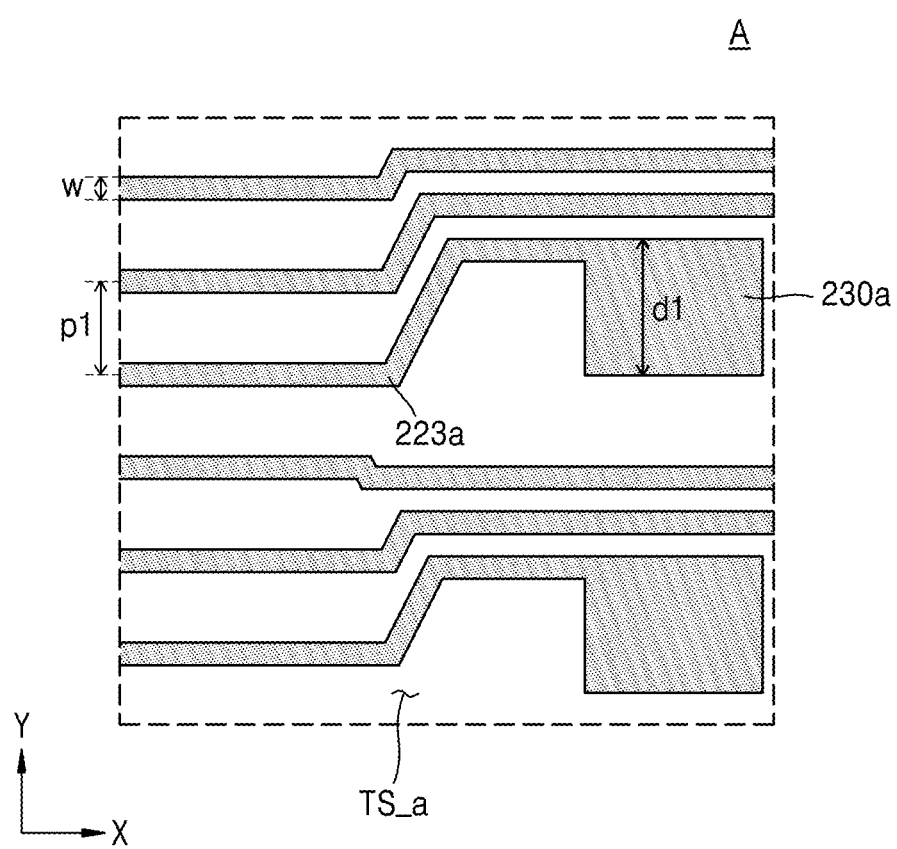
FIG. 3 is an enlarged view of a region A in FIG. 2.

FIG. 2 is a plan view of a test section TS1 of the package substrate film 10, according to an embodiment. FIG. 3 is an enlarged view of a region A in FIG. 2.

Referring to FIGS. 2 and 3 together, the test section TS1 of the package substrate film 10 may be distinguished into or include a first test section TS_a and a second test section TS_b, e.g., by or about a central axis C. The central axis C may extend in a direction (e.g., Y direction) vertical or orthogonal to a direction (e.g., X direction) in which the film substrate 110 extends, and may include an axis that crosses between the first test pad 230a and the second test pad 230b.

In an implementation, the first test section TS_a may be inside or at one side of the central axis C, and may include a section in which the first upper test line pattern 223a and the first test pad 230a are arranged. In an implementation, the second test section TS_b may be outside or at another side of the central axis C, and may include a section in which the second upper test line pattern 223b and the second test pad 230b are arranged.

In an implementation, the first upper test line pattern 223a and the first test pad 230a may be in the first test section TS_a, and the first test section TS_a may be a portion of the test section TS in which the second upper test line pattern 223b and the second test pad 230b are not arranged. In an implementation, the second upper test line pattern 223b and the second test pad 230b may be in the second test section TS_b, and the second test section TS_b may include a section in which the first upper test line pattern 223a and the first test pad 230a are not arranged.

In an implementation, in the first test section TS_a and the second test section TS_b, the first upper test line pattern 223a and the second upper test line pattern 223b may cross or face each other, and may not be arranged (e.g., cross arranged). In an implementation, the first test section TS_a may include only the first upper test line pattern 223a (e.g., and not the second upper test line pattern 223b) and the second test section TS_b may include only the second upper test line pattern 223b (e.g., and not the first upper test line pattern 223a).

In an implementation, a width w (e.g., in the Y direction) of each of the first upper test line pattern 223a and the second upper test line pattern 223b may increase (e.g., relative to other devices). When the test section TS of the film substrate 110 is viewed in a plan view, the width w of each of the first upper test line pattern 223a and the second upper test line pattern 223b may be defined as a thickness of each of the first upper test line pattern 223a and the second upper test line pattern 223b, respectively (e.g., in the Y direction).

In an implementation, the widths w of the first upper test line pattern 223a and the second upper test line pattern 223b may exceed about 8 micrometers. In an implementation, the widths w of the first upper test line pattern 223a and the second upper test line pattern 223b may each be about 10 micrometers to about 20 micrometers.

In an implementation, a pitch p1 between the first upper test line patterns 223a and a pitch p2 between the second upper test line patterns 223b may increase (e.g., relative to other devices). When the test section TS of the film substrate 110 is viewed in a plan view, the pitch p1 between the first upper test line patterns 223a and the pitch p2 between the second upper test line patterns 223b may be defined as a distance between the centers of adjacent first upper test line patterns 223a and a distance between the centers of adjacent second upper test line patterns 223b, respectively (e.g., along the Y direction).

In an implementation, the pitch p1 between the first upper test line patterns 223a and the pitch p2 between the second upper test line patterns 223b (e.g., as measured at ends thereof) may not exceed about 15 micrometers. In an implementation, the pitch p1 between the first upper test line patterns 223a and the second pitch p2 between the second upper test line patterns 223b may be about 20 micrometers to about 40 micrometers.

The widths w and the pitches p1 and p2 of a plurality of first test pads 230a and a plurality of second test pads 230b of the package substrate film 10 according to an embodiment may increase, respectively, short defects of the package substrate film 10 may be reduced, and an electrical connection path of the package substrate film 10 may be improved.

In an implementation, each of the first test pad 230a and the second test pad 230b may be provided in a plurality. In an implementation, the first test pad 230a may be inside the central axis C (e.g., in the first test section TS_a) in a plurality. In an implementation, the second test pad 230b may be provided outside the central axis C (e.g., in the second test section TS_b) in a plurality.

In an implementation, the plurality of first test pads 230a and the plurality of second test pads 230b may each have, e.g., a rectangular shape or other shape.

In an implementation, distances or widths d1 and d2 in a direction (e.g., Y direction) of the plurality of first test pads 230a and the plurality of second test pads 230b may not exceed about 130 micrometers, respectively.

In an implementation, the widths d1 and d2 in the Y direction of the plurality of first test pads 230a and the plurality of second test pads 230b may each be about 140 micrometers to about 300 micrometers, respectively.

In an implementation, the widths d1 and d2 of the plurality of first test pads 230a and the plurality of second test pads 230b of the package substrate film 10 may each be about 140 micrometers to about 300 micrometers, respectively, and contact defects of the plurality of first test pads 230a and the plurality of second test pads 230b of a test pin (710 in FIG. 15) of a test device (700 in FIG. 15) for testing the package substrate film 10 may be reduced.

In an implementation, the plurality of first test pads 230a and the plurality of second test pads 230b may be arranged to be symmetrical based on or about the central axis C. In an implementation, if the first test section TS_a (in which the plurality of first test pads 230a are formed) were to be folded about the central axis C, the plurality of first test pads 230a may be (e.g., vertically) superimposed with the plurality of second test pads 230b.

The plurality of first test pads 230a and the plurality of second test pads 230b may be symmetrically arranged about the central axis C, and accordingly, a movement of the test device (e.g., a probe card) in the test operation of the package substrate film 10 may be regular. In an implementation, a test yield of the package substrate film 10 by using the test device may be improved.

In an implementation, the plurality of first test pads 230a and the plurality of second test pads 230b may be arranged asymmetrically about the central axis C.

In an implementation, the first test pads 230a and the second test pads 230b may include the plurality of first test pads 230a and the plurality of second test pads 230b of substantially the same size, respectively.

In an implementation, the first test pad 230a and the second test pad 230b may include the plurality of first test pads 230a and the plurality of second test pads 230b of different sizes, respectively.

In an implementation, a scribe lane SL for the individualization of the package substrate film 10 according to the embodiment may be in the first test section TS_a.

In an implementation, when the package substrate film 10 is individualized at the scribe lane SL, portions of the first test pad 230a and the first upper test line pattern 223a in the first test section TS_a may be removed, and the second test pad 230b, the second upper test line pattern 223b, and the second test via pattern 227b of the second test section TS_b may also be removed.

In an implementation, when the package substrate film 10 is individualized at the scribe lane SL, portions of the first test via pattern 227a and the first upper test line pattern 223a may remain.

Figure 4:
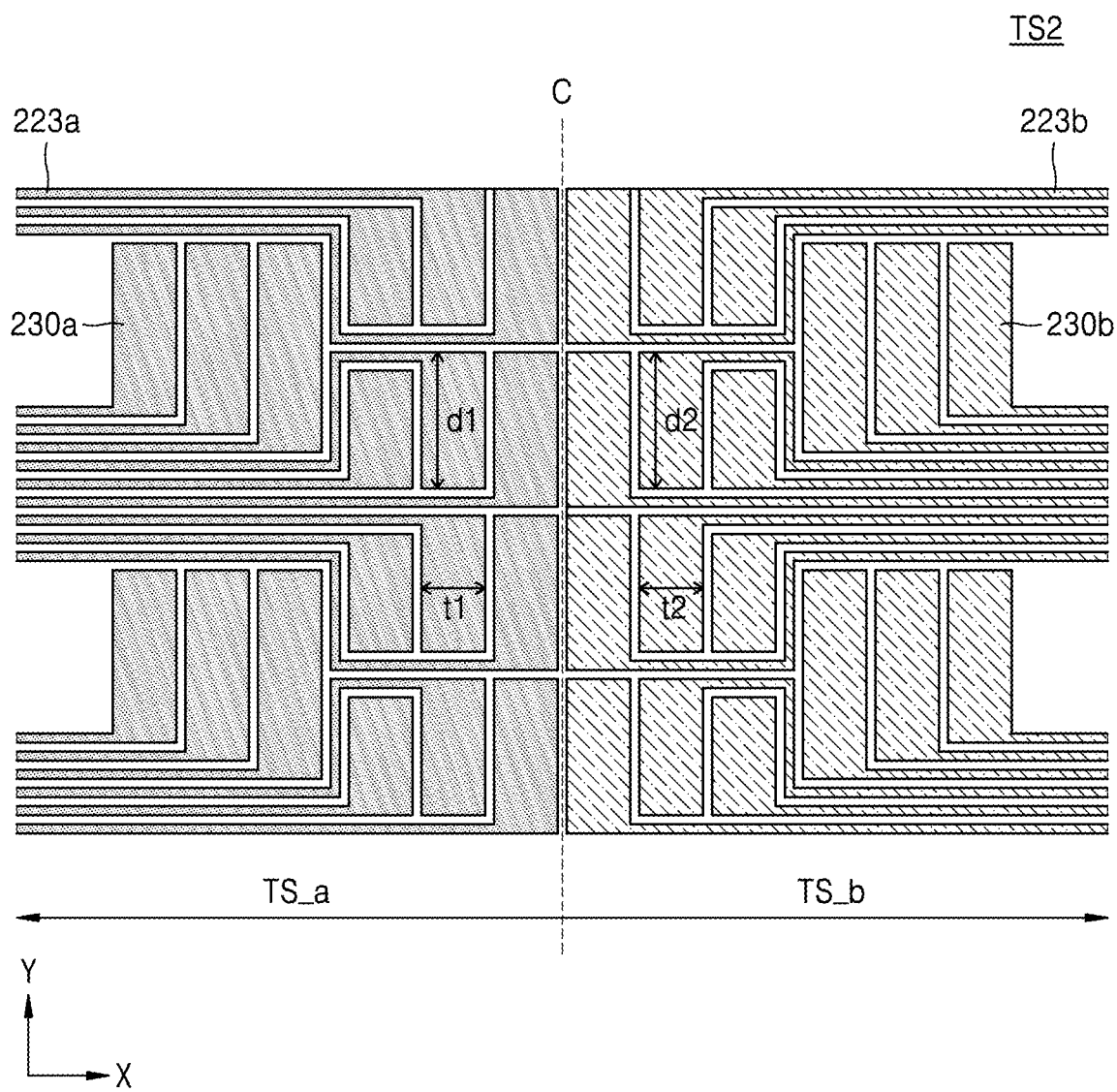
FIG. 4 is a plan view of a test section of a package substrate film, according to an embodiment.

FIG. 4 is a plan view of a test section TS2 of the package substrate film 10, according to an embodiment.

In an implementation, the test section TS2 of the package substrate film 10 may be distinguished into or include the first test section TS_a and a second test section TS_b, e.g., at sides of the central axis C. The central axis C may extend in the direction (e.g., Y direction) orthogonal to the direction (e.g., X direction) in which the film substrate 110 extends, and may include an axis that crosses between the first test pad 230a and the second test pad 230b.

In an implementation, the first test section TS_a may be inside (e.g., at one side of) the central axis C, and may include a section in which the first upper test line pattern 223a and the first test pad 230a are arranged. In an implementation, the second test section TS_b may be outside (e.g., at another side of) the central axis C, and may include a section in which the second upper test line pattern 223b and the second test pad 230b are arranged.

In an implementation, the plurality of first test pads 230a and the plurality of second test pads 230b may be arranged to be symmetrical based on or about the central axis C. In an implementation, if the first test section TS_a (in which the plurality of first test pads 230a are formed) were to be folded at the central axis C, the plurality of first test pads 230a may be (e.g., vertically) superimposed with or on the plurality of second test pads 230b.

In an implementation, the plurality of first test pads 230a and the plurality of second test pads 230b may be arranged asymmetrically about the central axis C.

In an implementation, the first test pad 230a and the second test pad 230b may include the plurality of first test pads 230a and the plurality of second test pads 230b of different sizes, respectively.

In an implementation, lengths in the X direction (e.g., parallel with a direction in which the film substrate 110 extends) of the plurality of first test pads 230a and the plurality of second test pads 230b may be defined as first lengths t1 and t2, respectively, and lengths in the Y direction (e.g., orthogonal to the X direction) of first test pads 230a and the plurality of second test pads 230b may be defined as second lengths d1 and d2, respectively.

The first length t1 of each first test pad 230a may be less than the second length d1 of each first test pad 230a and the first length t2 of each second test pad 230b may be less than the second length d2 of each second test pad 230b.

In an implementation, the second lengths d1 and d2 of each first test pad 230a and each second test pad 230b may exceed about 130 micrometers, respectively. In an implementation, the second lengths d1 and d2 of each first test pad 230a and each second test pad 230b may exceed about 140 micrometers to about 300 micrometers, respectively.

In an implementation, when the first test pad 230a and the second test pad 230b include the plurality of first test pads 230a and the plurality of second test pads 230b, which are provided in different sizes, respectively, the second lengths d1 and d2 of the first test pad 230a and second test pad 230b, which have smallest sizes among the plurality of first test pads 230a and second test pads 230b, may be about 140 micrometers to about 160 micrometers, respectively.

In an implementation, the second lengths d1 and d2 of the first test pad 230a and second test pad 230b, which have smallest sizes among the plurality of first test pads 230a and second test pads 230b, may be about 156 micrometers, respectively.

In an implementation, when the first test pad 230a and the second test pad 230b include the plurality of first test pads 230a and the plurality of second test pads 230b, which are provided in different sizes, respectively, the second lengths d1 and d2 of the first test pad 230a and second test pad 230b, which have largest sizes among the plurality of first test pads 230a and second test pads 230b, may be about 250 micrometers to about 300 micrometers, respectively.

In an implementation, the second lengths d1 and d2 of the first test pad 230a and second test pad 230b, which have largest sizes among the plurality of first test pads 230a and second test pads 230b, may be about 279 micrometers, respectively.

The first test pad 230a and the second test pad 230b of the package substrate film 10 according to an embodiment may be between the first test via pattern 227a and the second test via pattern 227b, and accordingly, spatial utilization on the film substrate 110 of the first test pad 230a and the second test pad 230b may be improved.

Accordingly, a size of the package substrate film 10 according to an embodiment may be reduced. In an implementation, areas of the first test pad 230a and the second test pad 230b may be increased, and accordingly, the yield of the test process by using the first test pad 230a and the second test pad 230b may be improved.

Figure 5:
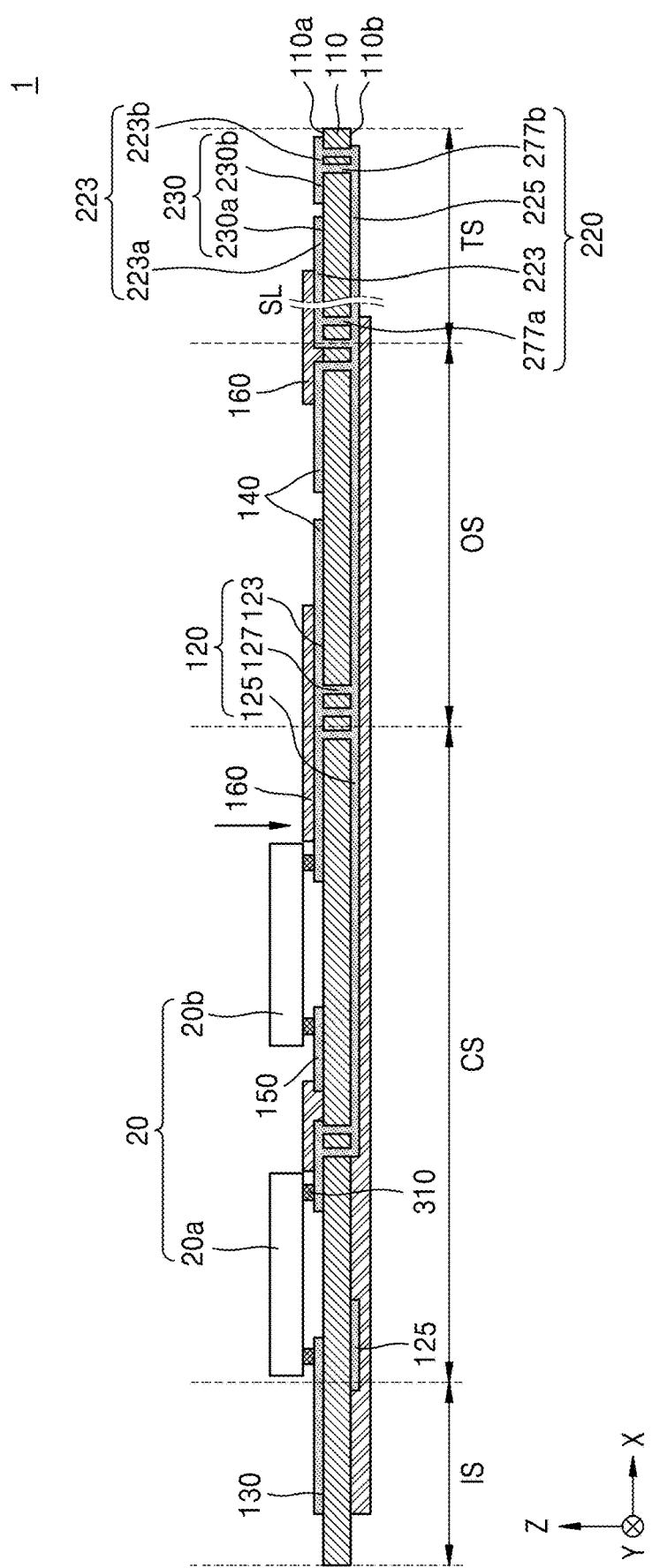
FIG. 5 is a cross-sectional view of a semiconductor package according to an embodiment.

FIG. 5 is a cross-sectional view of a semiconductor package 1 according to an embodiment.

The semiconductor package 1 according to an embodiment may include the package substrate film 10 and the semiconductor chip 20 mounted on the package substrate film 10.

The semiconductor package 1 according to an embodiment may include the COF package. In an implementation, the semiconductor package 1 may include a semiconductor package for performing a function of implementing colors by controlling pixels of a display panel.

The package substrate film 10 of the semiconductor package 1 may be the same as that described with reference to FIG. 1 through FIG. 4, and repeated detailed descriptions thereof may be omitted.

In an implementation, the package substrate film 10 of the semiconductor package 1 may be in made individualized by performing a cutting process at the scribe lane SL. In an implementation, the scribe lane SL may pass through the test section TS of the package substrate film 10.

In an implementation, when the first test via pattern 227a passes through at least one of the chip section CS, the input section IS, and the output section OS of the film substrate 110, the first test via pattern 227a may not be removed and may remain in the package substrate film 10.

In an implementation, when the first test via pattern 227a passes through the test section TS of the film substrate 110, the first test via pattern 227a may be removed.

In an implementation, when a portion of the first test via pattern 227a passes through at least one of the chip section CS, the input section IS, and the output section OS, and the other portion thereof passes through the test section TS of the film substrate 110, a portion of the first test via pattern 227a may be removed, and the other portion thereof may remain in the package substrate film 10.

In an implementation, the second test via pattern 227b may pass through the test section TS. Accordingly, when the package substrate film 10 is individualized, the second test via pattern 227b may be removed.

In an implementation, when the first upper test line pattern 223a is on the output section OS and the test section TS of the film substrate 110, and the package substrate film 10 is individualized, a portion of the first upper test line pattern 223a may remain in the package substrate film 10.

The semiconductor chip 20 of the semiconductor package 1 may be on the chip section CS of the film substrate 110. The semiconductor chip 20 may include a semiconductor chip that performs a function of, e.g., implementing colors by controlling pixels of the display panel. In an implementation, the semiconductor chip 20 may include a display driver (DD) integrated circuit (IC) (DDI).

In an implementation, the semiconductor chip 20 may include first and second semiconductor chips 20a and 20b. As illustrated in FIG. 5, the semiconductor chip 20 may include the first semiconductor chip 20a and the second semiconductor chip 20b.

In an implementation, the first semiconductor chip 20a and the second semiconductor chip 20b may include semiconductor chips of different types. Accordingly, the semiconductor package 1 may include a system in package (SIP) in which the first and second semiconductor chips 20a and 20b of different types are electrically connected to each other and operate as one system.

In an implementation, the first and second semiconductor chips 20a and 20b may include semiconductor chips of the same type.

In an implementation, the first and second semiconductor chips 20a and 20b may include active layers at portions adjacent to lower surfaces thereof. In an implementation, each of the first and second semiconductor chips 20a and 20b may include an active layer at a portion thereof adjacent to one surface facing the upper surface 110a of the film substrate 110.

In an implementation, the active layers of the first and second semiconductor chips 20a and 20b may include a plurality of individual devices of various types. In an implementation, the plurality of individual devices may include various micro-electronic devices, e.g., a complementary metal-oxide-semiconductor (CMOS) transistor, a metal-oxide-semiconductor field effect transistor (MOSFET), large scale integration (LSI), an image sensor such as a CMOS imaging sensor (CIS), a micro-electro-mechanical system (MEMS), an active device, a passive device, etc.

In an implementation, the first semiconductor chip 20a and the second semiconductor chip 20b may include the chip connection terminal 310. The first semiconductor chip 20a and the second semiconductor chip 20b may be flip-chip bonded to the film substrate 110 via the chip connection terminal 310.

The chip connection terminal 310 of the first semiconductor chip 20a and the second semiconductor chip 20b may contact the chip bonding pad 150 in the chip section CS on the upper surface 110a of the film substrate 110.

Figure 6:
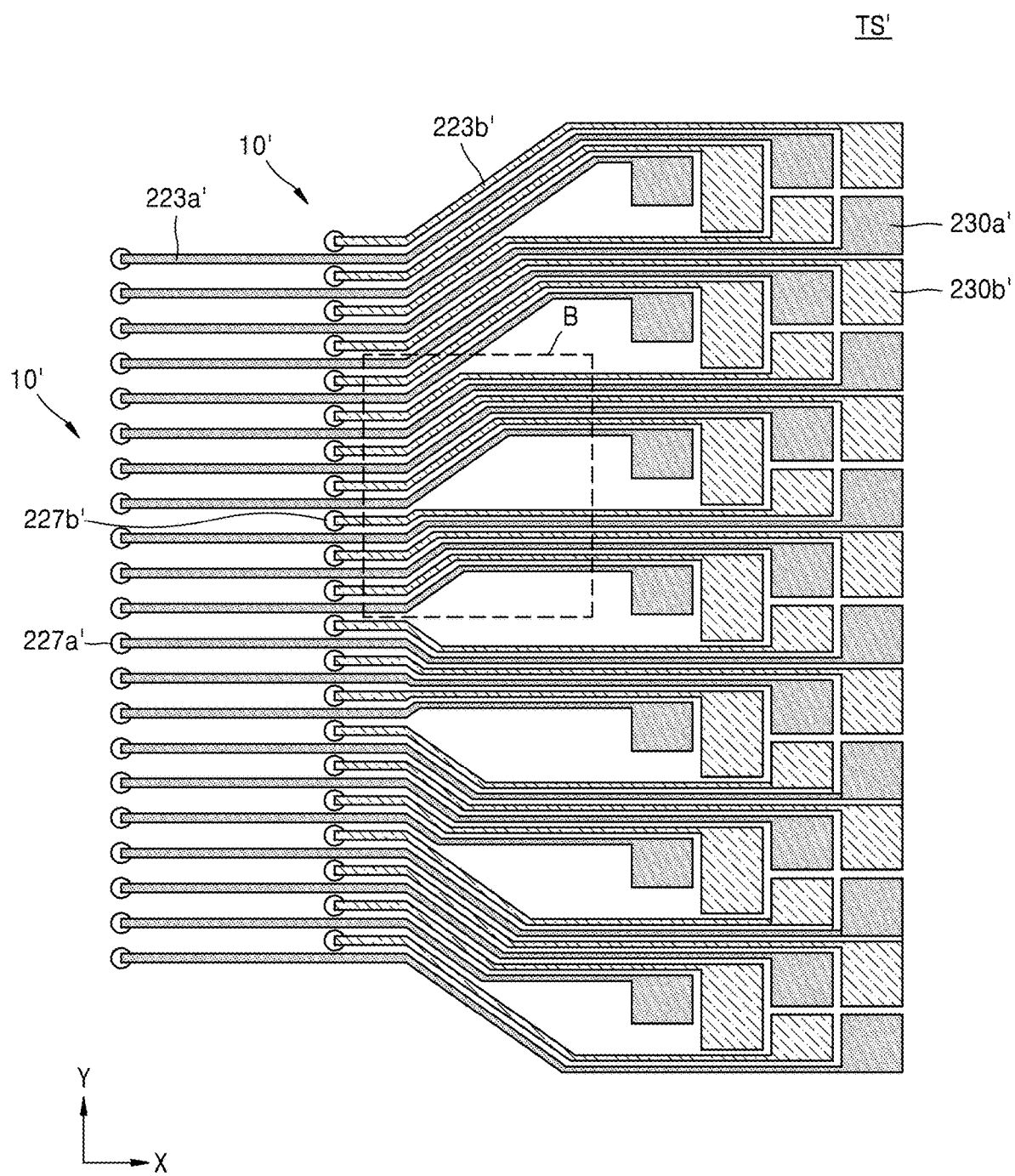
FIG. 6 is a plan view of a test section of a package substrate film, according to a comparative example.
Figure 7:
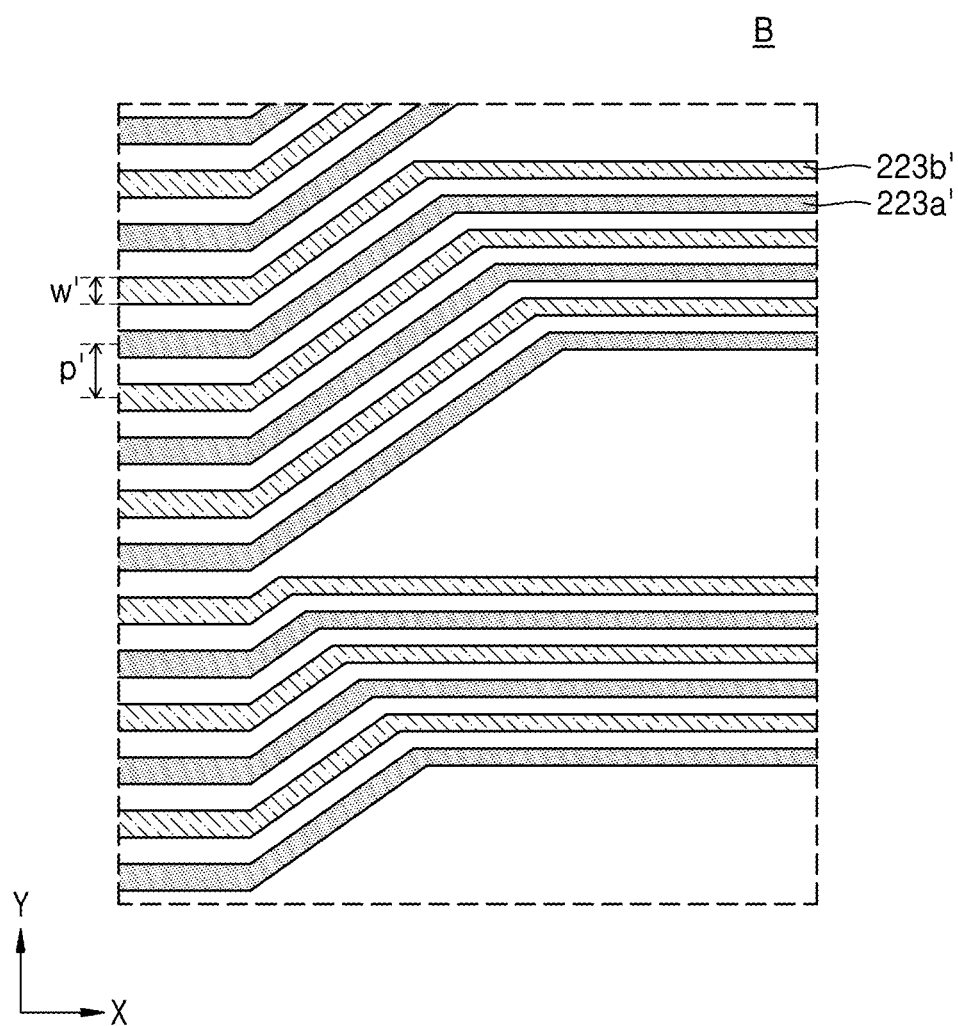
FIG. 7 is an enlarged view of a region B in FIG. 6.

FIG. 6 is a plan view of a test section TS' of a package substrate film 10', according to a comparative example. FIG. 7 is an enlarged view of a region B in FIG. 6. In addition, FIG. 8 is an image showing the test section TS' after a test on the package substrate film 10' according to the comparative example was performed.

Figure 8:
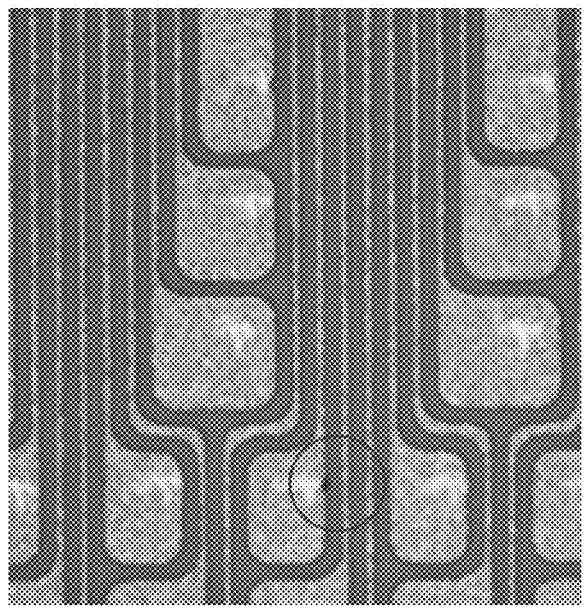
FIG. 8 is an image showing a test section after a test on a package substrate film according to a comparative example is performed.

Referring to FIGS. 6 through 8 together, a first test pad 230a' and a second test pad 230b' of the package substrate film 10' according to the comparative example may be on the outermost boundary of the package substrate film 10'.

In other words, both the first test pad 230a' and a second test pad 230b' of the package substrate film 10' according to the comparative example may be outside a first test via pattern 227a' and a second test via pattern 227b'.

As both the first test pad 230a' and the second test pad 230b' are arranged outside the first test via pattern 227a' and the second test via pattern 227b', sizes of the first test pad 230a' and the second test pad 230b' may be reduced due to a limited space of the film substrate 110.

For example, second lengths (e.g., lengths along the Y direction) of the first test pad 230a' and a second test pad 230b' of the package substrate film 10' may be less than about 130 micrometers, respectively.

Referring to FIG. 8, due to relatively small sizes of the first test pad 230a' and a second test pad 230b' of the package substrate film 10', contact defects of the first test pad 230a' and a second test pad 230b' of a probe device may occur.

In addition, as both the first test pad 230a' and the second test pad 230b' are arranged outside the first test via pattern 227a' and the second test via pattern 227b', signal flow directions of a first upper test line pattern 223a' connecting the first test via pattern 227a' to the first test pad 230a' and a second upper test line pattern 223b' connecting the second test via pattern 227b' to the second test pad 230b' may be substantially the same.

In addition, the second upper test line pattern 223b' may be between a plurality of first upper test line patterns 223a', and the first upper test line pattern 223a' may be between a plurality of second upper test line patterns 223b'.

Accordingly, widths w' (in the Y direction) of the first upper test line pattern 223a' and the second upper test line pattern 223b' may be relatively small. For example, the widths w' of the first upper test line pattern 223a' and the second upper test line pattern 223b' may be less than about 8 micrometers.

In addition, a pitch p', which is a separation distance (e.g., in the Y direction) between the first upper test line pattern 223a' and the second upper test line pattern 223b', may be relatively small. For example, the pitch p' between the first upper test line pattern 223a' and the second upper test line pattern 223b' may be less than about 15 micrometers.

As the width w' of the first upper test line pattern 223a' and the second upper test line pattern 223b' is relatively small, and the pitch p' between the first upper test line pattern 223a' and the second upper test line pattern 223b' is also relatively small, short defects between the first upper test line pattern 223a' and the second upper test line pattern 223b' may occur. In addition, the reliability of an electrical connection structure of the package substrate film 10' may be reduced.

The package substrate film 10 and the semiconductor package 1 including the same according to an embodiment may include the first test pad 230a and the second test pad 230b between the first test via pattern 227a and the second test via pattern 227b.

In an implementation, areas of the first test pad 230a and the second test pad 230b included in the package substrate film 10 may be increased (e.g., as compared with other devices), and the yield of the test process by using the first test pad 230a and the second test pad 230b may be improved. In an implementation, the size of the package substrate film 10 according to an embodiment may be reduced.

In an implementation, the package substrate film 10 may have the structure described above, and the width w and the first and second pitches p1 and p2 of the plurality of first test pads 230a and the plurality of second test pads 230b may increase (e.g., may be relatively greater than those of other types of devices), respectively. Accordingly, short defects of the package substrate film 10 according to an embodiment may be reduced, and the electrical connection path of the package substrate film 10 may be improved.

In an implementation, the plurality of first test pads 230a and the plurality of second test pads 230b of the package substrate film 10 may be arranged symmetrical with respect to or about the central axis C, and the movement of the test device (e.g., a probe card) in the test operation of the package substrate film 10 may be regular. Accordingly, the test yield of the package substrate film 10 by using the test device may be improved. In an implementation, the test speed of the package substrate film 10 by using the test device may be improved.

Figure 9:
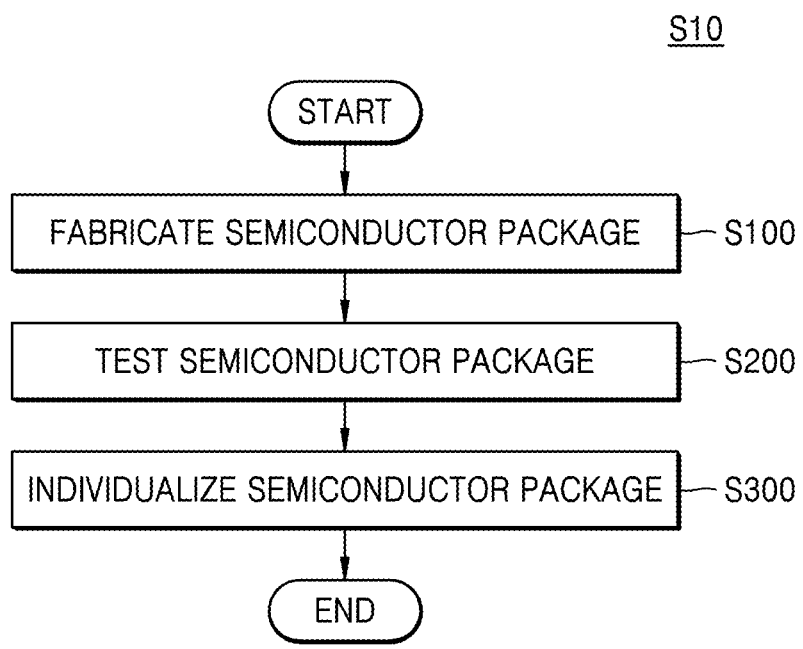
FIG. 9 is a flowchart of a flow of operations of fabrication, testing, and individualization of a semiconductor package, according to an embodiment.

FIG. 9 is a flowchart of a flow of methods of fabrication, testing, and individualization (S10) of the semiconductor package 1, according to an embodiment. FIG. 9 is a flowchart of the flow of the methods of fabrication, testing, and individualization (S10) of the semiconductor package 1 including the COF.

Figure 10:
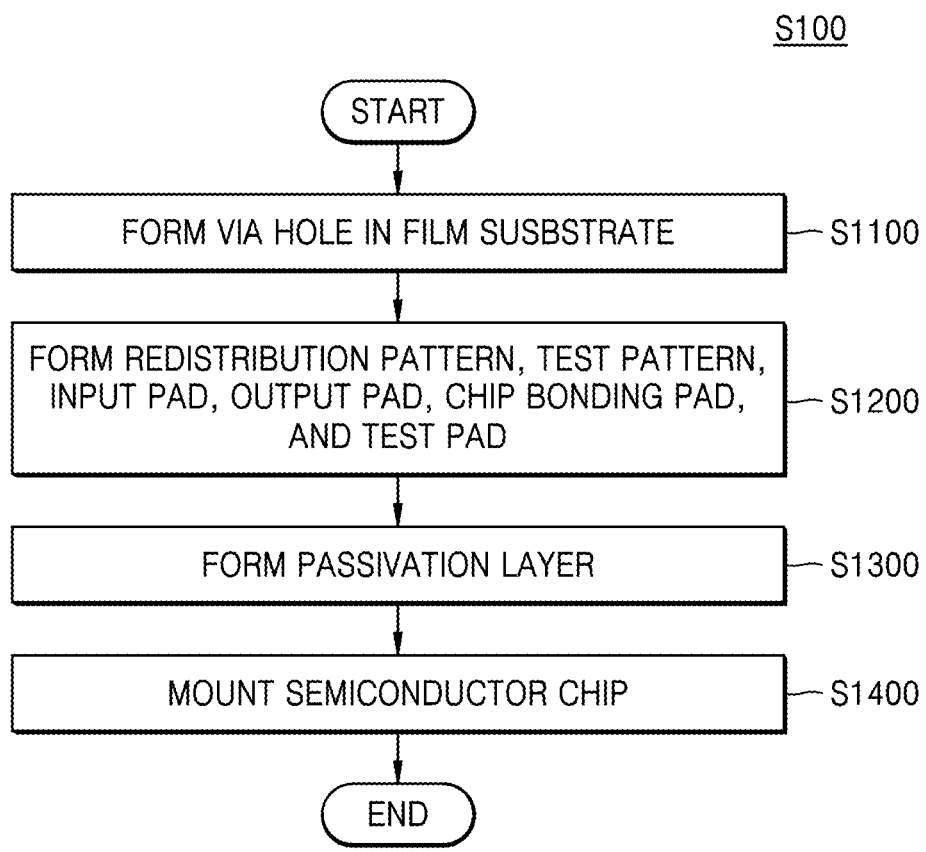
FIG. 10 is a flowchart of a flow of an operation of fabrication of a semiconductor package, according to an embodiment.

FIG. 10 is a flowchart of a flow of a method of fabrication (S100) of the semiconductor package 1, according to an embodiment. FIG. 10 is a flowchart of the flow of the method of fabrication (S100) of the semiconductor package 1 including the COF before individualization.

In addition, FIGS. 11 through 16 are stages in the method of fabrication, testing, and individualization (S10) of the semiconductor package 1, according to embodiments.

Referring to FIGS. 9 and 10 together, the method of fabrication, testing, and individualization (S10) of the semiconductor package 1 according to embodiments may include fabricating the semiconductor package 1 including the COF (S100), testing the signal flow of the semiconductor package 1 including the COF (S200), and individualizing the semiconductor package 1 including the COF (S300).

In an implementation, the method of fabrication of the semiconductor package 1 including the COF (S100) according to an embodiment may include forming a via hole H in the film substrate 110 (S1100), forming the redistribution pattern 120, the input pad 130, the output pad 140, the chip bonding pad 150, the test pattern 220, and the test pad 230 (S1200), forming the passivation layer 160 (S1300), and mounting the semiconductor chip 20 (S1400).

Figure 11:
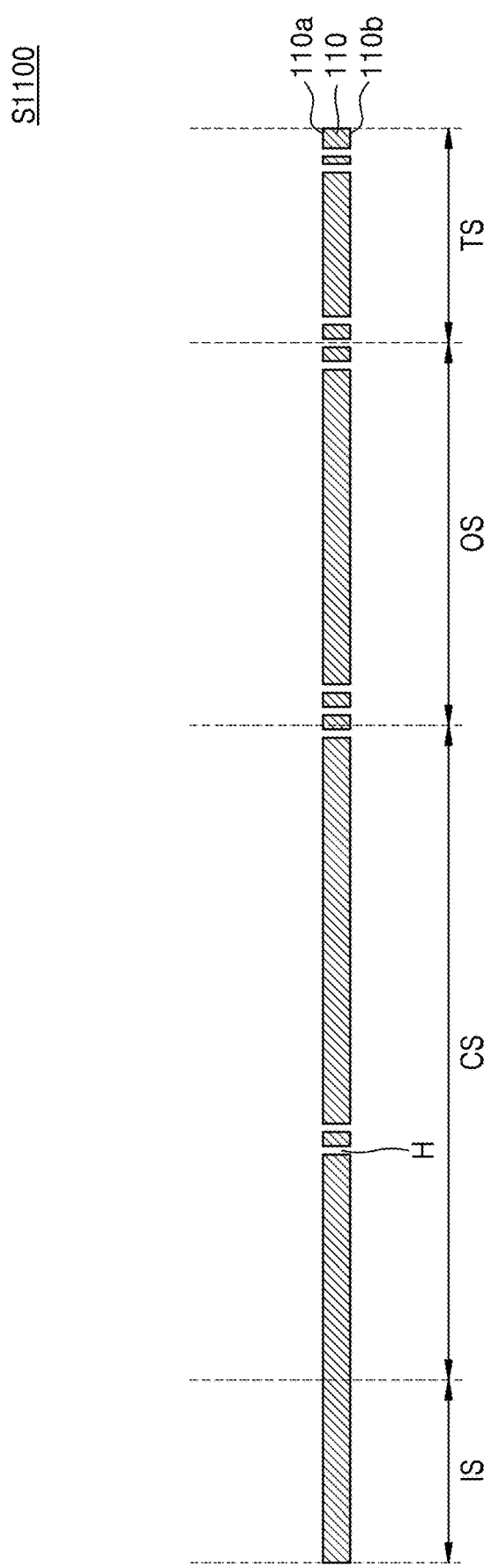
FIGS. 11 through 16 are stages in a method of fabrication, testing, and individualization of a semiconductor package, according to embodiments.

Referring to FIGS. 9, 10, and 11 together, operation S1100 may include an operation of forming the via hole H in the film substrate 110. The via hole H of the film substrate 110 may be filled with a conductive material in operation S1200, and the via hole H filled with the conductive material may function as the redistribution via pattern 127, the first test via pattern 227a, and the second test via pattern 227b.

In an implementation, operation S1100 may include an operation of forming the via hole H that penetrates the film substrate 110 in the vertical direction by using a laser drilling process or an etching process.

Figure 12:
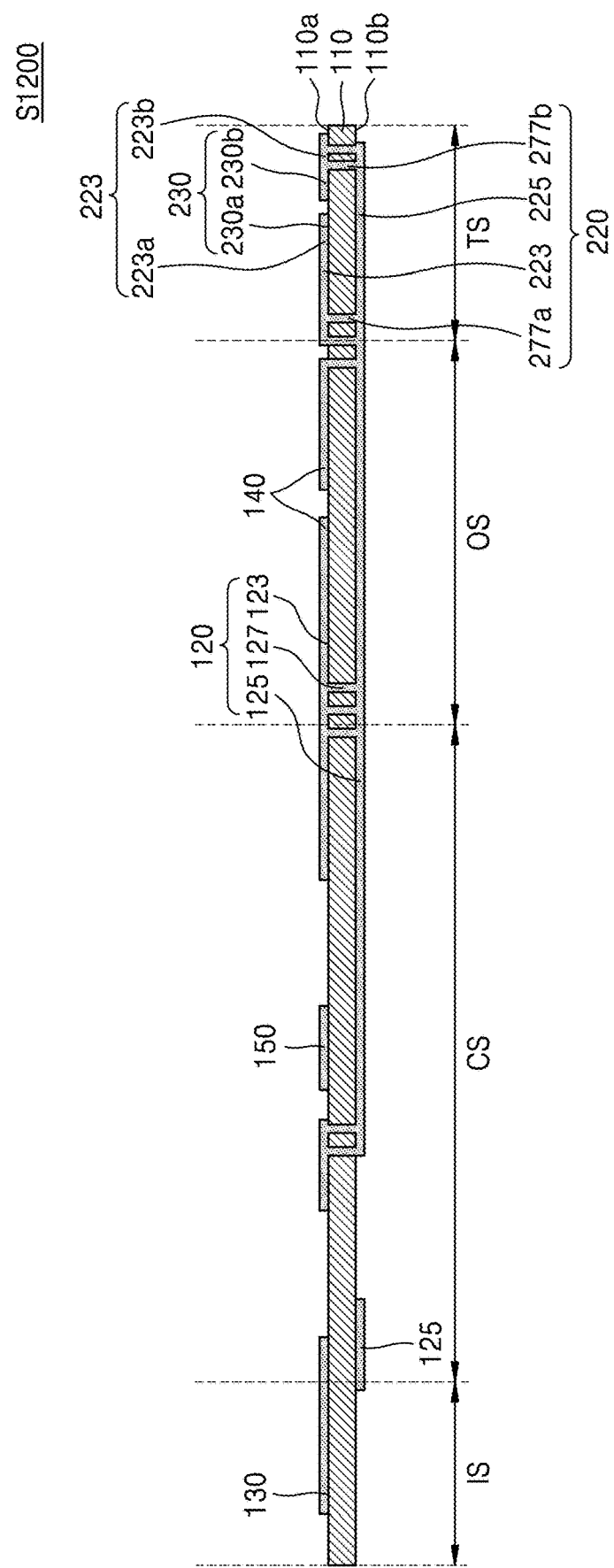

Referring to FIGS. 9, 10, and 12 together, operation S1100 may include an operation of forming the redistribution pattern 120, the input pad 130, the output pad 140, the chip bonding pad 150, the test pattern 220, and the test pad 230 by using a photolithography process, a plating process, and an etching process, or the like on the upper surface 110a and the lower surface 110b of the film substrate 110.

In an implementation, an operation of forming the redistribution pattern 120 may include operations of forming the redistribution via pattern 127 by filling the via hole H of the film substrate 110 with a conductive material, forming of the upper redistribution line pattern 123 extending on the upper surface 110a of the film substrate 110 and being connected to the redistribution via pattern 127, and forming the lower redistribution line pattern 125 extending on the lower surface 110b of the film substrate 110 and being connected to the redistribution via pattern 127.

In an implementation, an operation of forming the input pad 130 may include an operation of forming the input pad 130 connected to the upper redistribution line pattern 123 in the input section IS on the upper surface 110a of the film substrate 110.

In an implementation, an operation of forming the output pad 140 may include an operation of forming the output pad 140 connected to the upper redistribution line pattern 123 on the output section OS on the upper surface 110a of the film substrate 110.

In an implementation, an operation of forming the chip bonding pad 150 may include an operation of forming the chip bonding pad 150 connected to the upper redistribution line pattern 123 on the chip section CS on the upper surface 110a of the film substrate 110.

In an implementation, an operation of forming the test pattern 220 may include operations of forming the first test via pattern 227a and the second test via pattern 227b by filling the via hole H of the film substrate 110 with a conductive material, forming the lower test line pattern 225 extending on the lower surface 110b of the film substrate 110 and being connected to the first test via pattern 227a and the second test via pattern 227b, and forming the first upper test line pattern 223a extending on the upper surface 110a of the film substrate 110 and being connected to the first test via pattern 227a, and the second upper test line pattern 223b extending on the upper surface 110a of the film substrate 110 and being connected to the second test via pattern 227b.

In an implementation, an operation of forming the test pad 230 may include operations of forming the first test pad 230a connected to the first upper test line pattern 223a, and forming the second test pad 230b connected to the second upper test line pattern 223b.

In an implementation, the first test pad 230a may be formed outside the first test via pattern 227a, and the second test pad 230b may be formed inside the second test via pattern 227b. In an implementation, each of the first test pad 230a and the second test pad 230b may be formed between the first test via pattern 227a and the second test via pattern 227b. In an implementation, the first test pad 230a and the second test pad 230b may be formed on the test section TS of the film substrate 110 to face each other.

Figure 13:
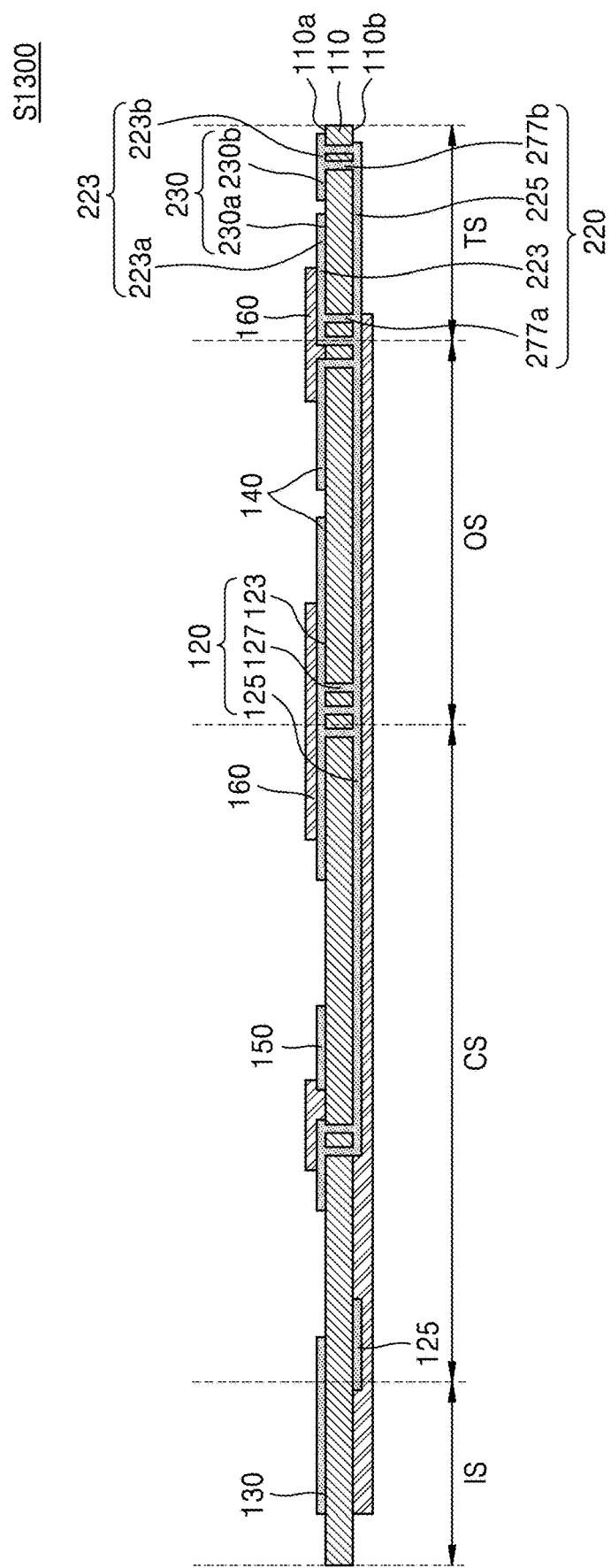

Referring to FIGS. 9, 10, and 13 together, operation S1300 may include an operation of forming the passivation layer 160 by applying a coating process, a photolithography process, an etching process, etc.

In an implementation, the passivation layer 160 may be formed to extend on the upper surface 110a of the film substrate 110, and cover the upper redistribution line pattern 123, the first upper test line pattern 223a, and the second upper test line pattern 223b. In an implementation, the passivation layer 160 may expose the input pad 130, the output pad 140, and the chip bonding pad 150, which are arranged on the upper surface 110a of the film substrate 110, without covering them.

In an implementation, the passivation layer 160 may be formed to extend on the lower surface 110b of the film substrate 110 and cover the lower redistribution line pattern 125 and the lower test line pattern 225.

Figure 14:
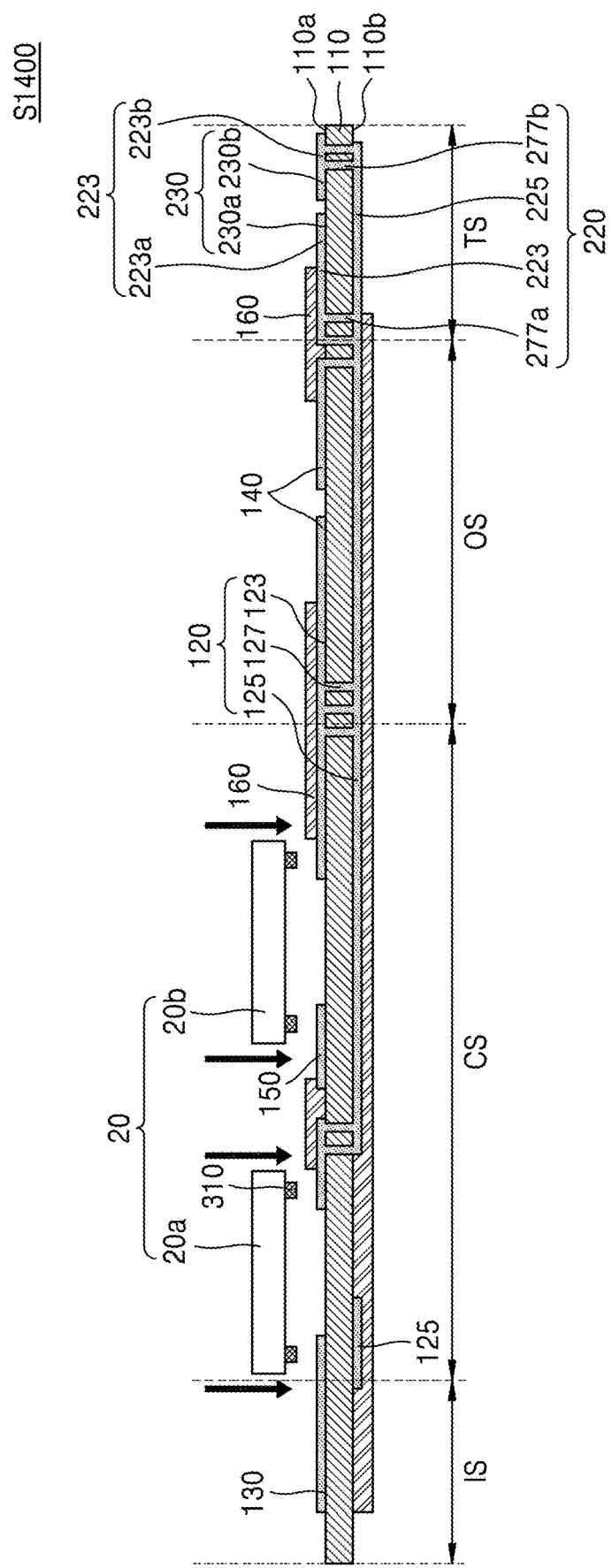

Referring to FIGS. 9, 10, and 14 together, operation S1400 may include an operation of mounting the semiconductor chip 20 on the chip section CS of the film substrate 110 by applying a flip chip bonding.

In an implementation, the semiconductor chip 20 may be mounted in the chip section CS of the film substrate 110 so that the chip connection terminal 310 of the semiconductor chip 20 contacts the chip bonding pad 150 on the chip section CS of the film substrate 110 (S1400).

In an implementation, the plurality of first and second semiconductor chips 20a and 20b may be mounted on the chip section CS of the film substrate 110 (S1400). In an implementation, the plurality of first and second semiconductor chips 20a and 20b may include semiconductor chips of different types from each other. Accordingly, the semiconductor package 1 fabricated in operation S1400 may include a system in package (SIP) in which the plurality of first and second semiconductor chips 20a and 20b of different types from each other are electrically connected to each other, and operate as one system.

By performing operations S1100 through S1400, the semiconductor package 1 before being individualized according to an embodiment may be fabricated.

Figure 15:
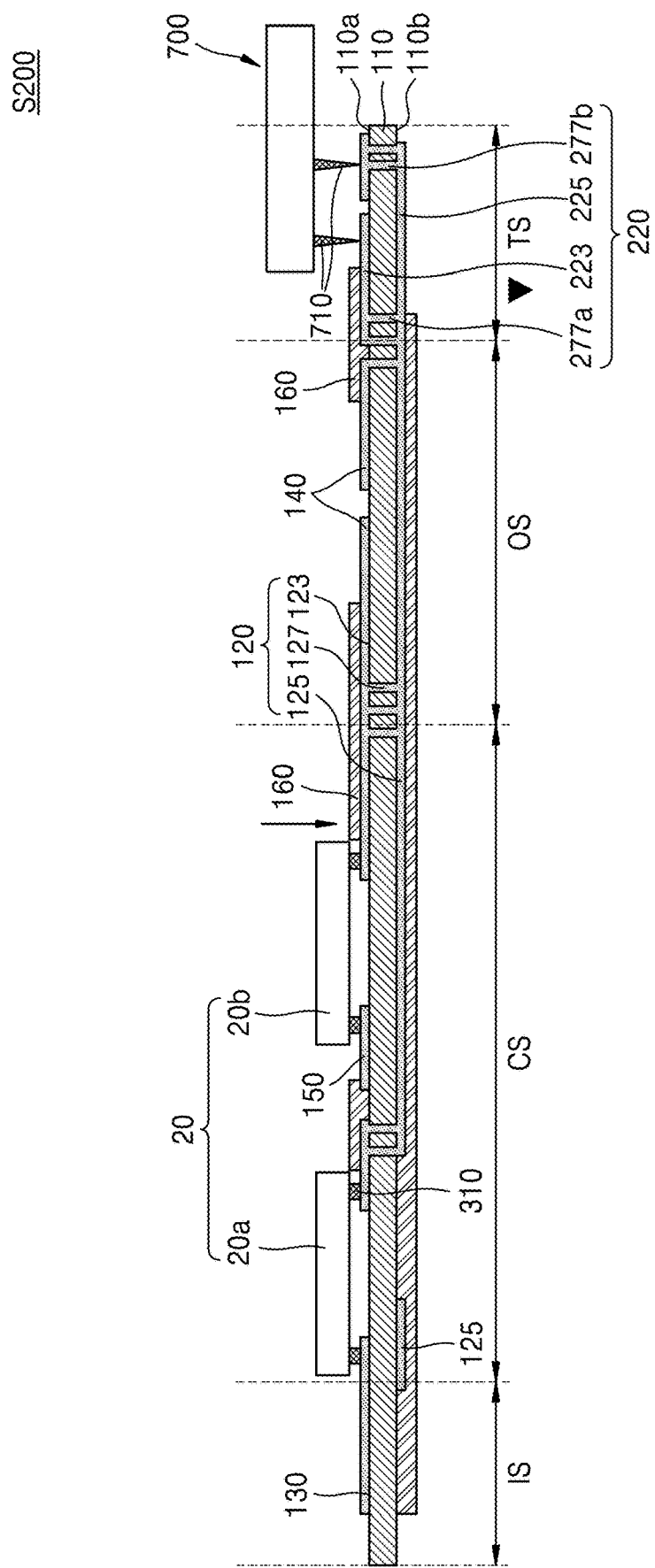

Referring to FIGS. 9 and 15 together, operation S200 may include an operation of testing the electrical signal flow of the semiconductor package 1 including the COF that has been fabricated by performing operation S100 by using a test device 700.

The test device 700 that includes a test pin 710 for the electrical signal flow test of the semiconductor package 1 may be used (S200). In an implementation, the test device 700 may include the probe card.

In an implementation, operation S200 may include operations of contacting the test pin 710 of the test device 700 to the first test pad 230a and the second test pad 230b of the semiconductor package 1, applying an electrical signal to the first test pad 230a and the second test pad 230b via the test pin 710 of the test device 700, and determining defects of the semiconductor package 1 by using a signal to be identified from the applied electrical signal.

In an implementation, the first test pad 230a and the second test pad 230b of the semiconductor package 1 may be on the test section TS of the film substrate 110. In an implementation, the first test pad 230a and the second test pad 230b of the semiconductor package 1 may be between the first test via pattern 227a and the second test via pattern 227b, and may face each other.

Accordingly, the sizes of the first test pad 230a and the second test pad 230b may be increased (e.g., relative to other types of devices). In an implementation, the dimensions (e.g., second lengths) d1 and d2 extending in a direction (e.g., Y direction) vertical to a direction in which the film substrate 110 extends (e.g., X direction) among dimensions of the plurality of first test pads 230a and the plurality of second test pads 230b may be about 140 micrometers to about 300 micrometers, respectively.

In an implementation, the dimensions d1 and d2 extending in the Y direction vertical to the direction in which the film substrate 110 extends among the dimensions of the plurality of first test pads 230a and the plurality of second test pads 230b of the semiconductor package 1 according to an embodiment may be about 140 micrometers to about 300 micrometers, respectively, and contact defects of the plurality of first test pads 230a and the plurality of second test pads 230b of the test pin 710 of the test device 700 for testing the package substrate film 10 may be reduced.

In an implementation, the yield of the electrical signal flow test of the semiconductor package 1 by using the test device 700 may be improved.

Figure 16:
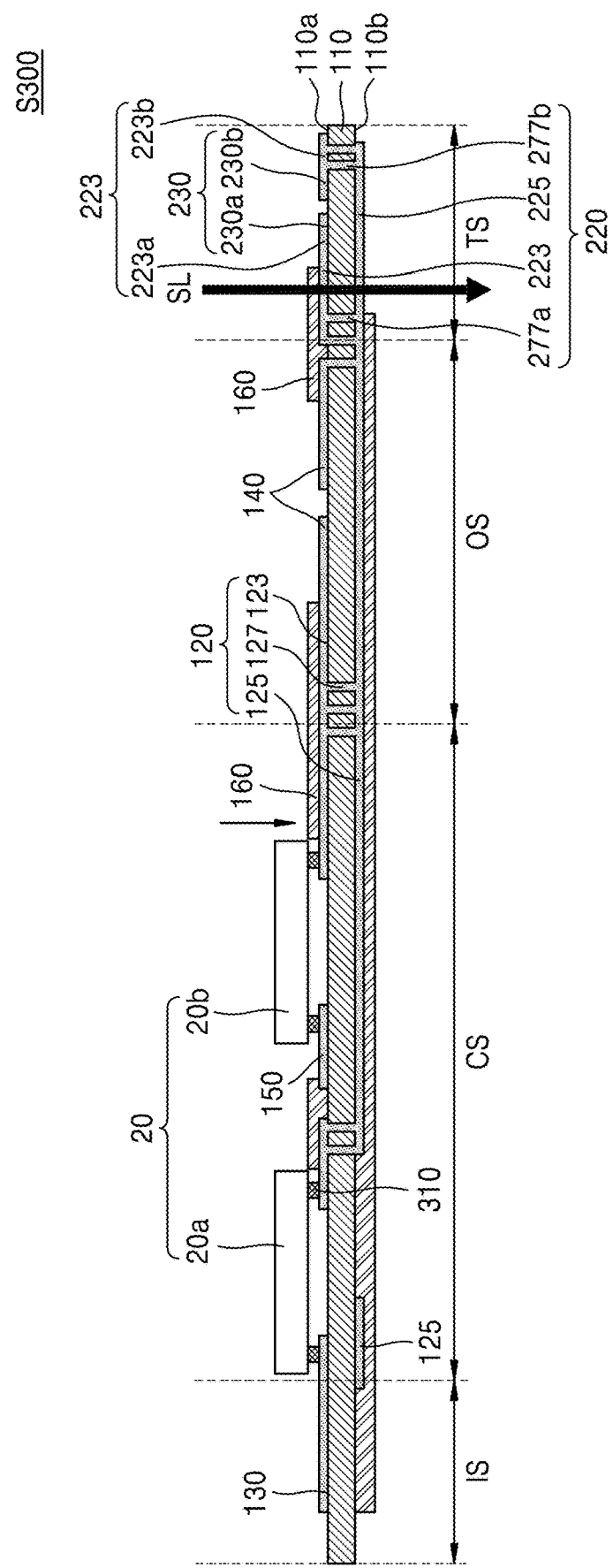

Referring to FIGS. 9 and 16 together, operation S300 may include an operation of individualization of the semiconductor package 1 including the COF in which operation S200 has been completed.

Operation S300 may include an operation of individualization of the semiconductor package 1 by cutting at the scribe lane SL of the semiconductor package 1. In an implementation, operation S300 may include an operation of cutting at the scribe lane SL by using a blade wheel. In an implementation, the operation S300 may include an operation of cutting the scribe lane SL by using a laser.

In an implementation, the scribe lane SL of the semiconductor package 1 may be on the test section TS. Accordingly, when the scribe lane SL of the semiconductor package 1 is cut, the first test pad 230a, the second test pad 230b, the second test via pattern 227b, and the second upper test line pattern 223b may be removed.

In an implementation, when the scribe lane SL of the semiconductor package 1 is cut, portions of the first test via pattern 227a and the first upper test line pattern 223a may remain.

One or more embodiments may provide a test device in a test process of a semiconductor package, and a semiconductor package including a package substrate film capable of reducing contact defects between test pads.

One or more embodiments may provide a semiconductor package of a reduced size by increasing the spatial utilization degree of test pads on a film substrate.

One or more embodiments may provide a semiconductor package that reduces short defects between test line patterns, and includes a package substrate film in which electrical connection paths are improved.

A package substrate film according to an embodiment may include a plurality of test pads arranged between a first via pattern and a second test via pattern. Due to a structure of a package substrate film according to an embodiment, an area of the plurality of test pads increases.

Accordingly, in a test process of a semiconductor package, contact defects between a test device and a test pad are reduced, a yield of the test process may be increased. In addition, due to a structure of a package substrate film according to an embodiment, a size of a semiconductor package may be reduced, and short defects between test line patterns may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A package substrate film, comprising:
   a film substrate including an upper surface and a lower surface;
   a chip bonding pad on a chip section of the film substrate; and
   a test pattern on a test section of the film substrate such that the entire test pattern is between the chip bonding pad and one outer edge of the film substrate, the test pattern including:
      an upper test line pattern extending on the upper surface of the film substrate;
      a lower test line pattern extending on the lower surface of the film substrate;
      a first test via pattern penetrating the film substrate and connecting the upper test line pattern to the lower test line pattern;
      a second test via pattern penetrating the film substrate at an outer side of the first test via pattern such that the first test via pattern is between the chip bonding pad and the second test via pattern, the second test via pattern connecting the upper test line pattern to the lower test line pattern; and
      a test pad between the first test via pattern and the second test via pattern, the test pad including at least one first test pad at an outer side of the first test via pattern; and at least one second test pad at an inner side of the second test via pattern and facing the at least one first test pad.

2. The package substrate film as claimed in claim 1, wherein the upper test line pattern includes:
   a first upper test line pattern connecting the at least one first test pad to the first test via pattern; and
   a second upper test line pattern connecting the at least one second test pad to the second test via pattern.

3. The package substrate film as claimed in claim 2, wherein a width of the first upper test line pattern and a width of the second upper test line pattern are each about 10 micrometers to about 20 micrometers.

4. The package substrate film as claimed in claim 2, wherein a pitch of the first upper test line pattern and a pitch of the second upper test line pattern are each about 20 micrometers to about 40 micrometers.

5. The package substrate film as claimed in claim 1, wherein the at least one first test pad and the at least one second test pad are arranged so that the at least one first test pad and the at least one second test pad are symmetrically arranged about a central axis that crosses between the at least one first test pad and the at least one second test pad.

6. The package substrate film as claimed in claim 1, wherein:
   the at least one first test pad includes a plurality of first test pads, at least two of the plurality of first test pads having different sizes, and
   the at least one second test pad includes a plurality of second test pads, at least two of the plurality of second test pads having different sizes.

7. The package substrate film as claimed in claim 6, wherein a length, as measured in a direction orthogonal to a direction in which the film substrate extends, of each first test pad of the plurality of first test pads and each second test pad of the plurality of second test pads is about 140 micrometers to about 300 micrometers.

8. A package substrate film, comprising:
   a film substrate including an upper surface and a lower surface, the film substrate including an input section, an output section, a chip section between the input section and the output section, and a test section arranged outside the output section such that the entire test section is between the chip section and one outer edge of the film substrate;

a redistribution pattern including:
an upper redistribution line pattern extending on the upper surface of the film substrate;
a lower redistribution line pattern extending on the lower surface of the film substrate; and
a redistribution via pattern penetrating the film substrate and connecting the upper redistribution line pattern to the lower redistribution line pattern; and a test pattern including:
an upper test line pattern extending on the upper surface of the film substrate;
a lower test line pattern extending on the lower surface of the film substrate;
a first test via pattern penetrating the film substrate and connecting the upper test line pattern to the lower test line pattern;
a second test via pattern penetrating the film substrate at an outer side of the first test via pattern such that the first test via pattern is between the chip section and the second test via pattern, the second test via pattern connecting the upper test line pattern to the lower test line pattern; and
a test pad on the test section of the film substrate and between the first test via pattern and the second test via pattern, the test pad including at least one first test pad at an outer side of the first test via pattern and at least one second test pad at an inner side of the second test via pattern and facing the at least one first test pad.

9. The package substrate film as claimed in claim 8, further comprising:
an input pad on the input section of the film substrate and connected to the upper redistribution line pattern;
an output pad on the output section of the film substrate and connected to the upper redistribution line pattern; and
a chip bonding pad on the chip section of the film substrate, connected to the upper redistribution line pattern, and including a semiconductor chip mounted thereon.

10. The package substrate film as claimed in claim 8, wherein:
the first test via pattern is penetrates the output section of the film substrate in a vertical direction, and
the second test via pattern penetrates the test section of the film substrate in the vertical direction.

11. The package substrate film as claimed in claim 8, wherein:
the upper test line pattern includes:
a first upper test line pattern connecting the at least one first test pad to the first test via pattern; and
a second upper test line pattern at an outer side of the first upper test line pattern and connecting the at least one second test pad to the second test via pattern, and
signal flow directions of the first upper test line pattern and the second upper test line pattern are opposite to each other.

12. The package substrate film as claimed in claim 11, wherein:
a width of the first upper test line pattern and a width of the second upper test line pattern are each about 10 micrometers to about 20 micrometers, and
a pitch of the first upper test line pattern and a pitch of the second upper test line pattern are each about 20 micrometers to about 40 micrometers.

13. The package substrate film as claimed in claim 8, wherein:
the at least one first test pad and the at least one second test pad each have a rectangular shape, and
first lengths, as measured in a direction parallel with a direction in which the film substrate extends, of each of the at least one first test pad and the at least one second test pad are less than second lengths, as measured in a direction orthogonal to the direction in which the film substrate extends, of each of the at least one first test pad and the at least one second test pad.

14. The package substrate film as claimed in claim 13, wherein:
the at least one first test pad includes a plurality of first test pads, at least two of the plurality of first test pads having different sizes,
the at least one second test pad includes a plurality of second test pads, at least two of the plurality of second test pads having different sizes, and
the second lengths of the plurality of first test pads and the plurality of second test pads are each about 140 micrometers to about 300 micrometers.

15. The package substrate film as claimed in claim 14, wherein the plurality of first test pads and the plurality of second test pads are arranged so that the plurality of first test pads and the plurality of second test pads are symmetrical to each other about a central axis that passes between the plurality of first test pads and the plurality of second test pads.

16. A semiconductor package, comprising:
a package substrate film including:
a film substrate including an upper surface and a lower surface, the film substrate including a test section, an input section, an output section, and a chip section between the input section and the output section such that the entire test section is between the chip section and one outer edge of the film substrate;
a redistribution pattern including:
an upper redistribution line pattern extending on the upper surface of the film substrate;
a lower redistribution line pattern extending on the lower surface of the film substrate; and
a redistribution via pattern penetrating the film substrate and connecting the upper redistribution line pattern to the lower redistribution line pattern;
a test pattern including:
an upper test line pattern extending on the upper surface of the film substrate;
a lower test line pattern extending on the lower surface of the film substrate;
a first test via pattern penetrating the film substrate and connecting the upper test line pattern to the lower test line pattern;
a second test via pattern penetrating the film substrate at an outer side of the first test via pattern such that the first test via pattern is between the chip section and the second test via pattern, the second test via pattern connecting the upper test line pattern to the lower test line pattern; and
a test pad on the test section of the film substrate and between the first test via pattern and the second test via pattern, the test pad including at least one first test pad at an outer side of the first test via pattern and at least one second test pad at an inner side the second via pattern; and a semiconductor chip on the chip section of the film substrate.

17. The semiconductor package as claimed in claim 16, wherein:

the package substrate film includes:

an input pad in the input section of the film substrate and connected to the upper redistribution line pattern;

an output pad in the output section of the film substrate and connected to the upper redistribution line pattern; and a chip bonding pad in the chip section of the film substrate, connected to the upper redistribution line pattern, and including the semiconductor chip mounted thereon, and the semiconductor chip is flip-chip bonded to the chip bonding pad, and connected to the upper redistribution line pattern.

18. The semiconductor package as claimed in claim 16, wherein the semiconductor chip includes a plurality of semiconductor chips of different types from each other.

19. The semiconductor package as claimed in claim 16, wherein:

the upper test line pattern includes:

a first upper test line pattern connecting the at least one first test pad to the first test via pattern; and a second upper test line pattern connecting the at least one second test pad to the second test via pattern, the at least one first test pad includes a plurality of first test pads, at least two of the plurality of first test pads having different sizes, and the at least one second test pad includes a plurality of second test pads, at least two of the plurality of second test pads having different sizes.

20. The semiconductor package as claimed in claim 16, wherein the at least one first test pad and the at least one second test pad are arranged symmetrical to each other about a central axis that crosses between the at least one first test pad and the at least one second test pad.

* * * * *